(12) United States Patent
Ishibashi et al.

(10) Patent No.: US 12,467,159 B2
(45) Date of Patent: Nov. 11, 2025

(54) P-TYPE SiC EPITAXIAL WAFER AND PRODUCTION METHOD THEREFOR

(71) Applicant: SHOWA DENKO K.K., Tokyo (JP)

(72) Inventors: Naoto Ishibashi, Chichibu (JP); Keisuke Fukada, Chichibu (JP); Akira Bandoh, Chichibu (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 16/471,784

(22) PCT Filed: Dec. 11, 2017

(86) PCT No.: PCT/JP2017/044335
§ 371 (c)(1),
(2) Date: Jun. 20, 2019

(87) PCT Pub. No.: WO2018/123534
PCT Pub. Date: Jul. 5, 2018

(65) Prior Publication Data
US 2019/0316273 A1    Oct. 17, 2019

(30) Foreign Application Priority Data
Dec. 28, 2016    (JP) .................................. 2016-255541

(51) Int. Cl.
*C30B 29/36* (2006.01)
*C30B 25/02* (2006.01)
(Continued)

(52) U.S. Cl.
CPC .............. *C30B 29/36* (2013.01); *C30B 25/02* (2013.01); *H01L 21/02529* (2013.01); *H10D 62/8325* (2025.01)

(58) Field of Classification Search
CPC ........... H01L 21/02529; H01L 29/1608; H01L 21/02433; H01L 21/0262; H01L 21/02579;
(Continued)

(56) References Cited

U.S. PATENT DOCUMENTS 4,087,133 A * 5/1978 Olofsen .............. H01L 21/6779
406/72
5,510,630 A * 4/1996 Agarwal ............. H01L 29/1608
257/77
(Continued)

FOREIGN PATENT DOCUMENTS

EP    3 352 200 A1    7/2018
JP    2012-033618 A   2/2012
(Continued)

OTHER PUBLICATIONS

Marcin Zielinski, et al., "p-type doping 4H- and 3C-SiC epitaxial layers with Aluminum", Materials Science Forum, 2016, pp. 137-142, vol. 858.
(Continued)

*Primary Examiner* — Ajay Ojha
(74) *Attorney, Agent, or Firm* — Sughrue Mion, PLLC (57) ABSTRACT

A method of producing a p-type SiC epitaxial wafer, the method including: a step of setting an input raw material C/Si ratio, being a ratio between the C element and the Si element in a feedstock gas; and a step of obtaining a p-type SiC epitaxial wafer having an Al dopant concentration of at least $1\times10^{18}$ cm$^{-3}$ by forming a p-type SiC epitaxial film on a substrate in a film-forming atmosphere comprising the feedstock gas, a Cl-based gas containing Cl in the molecule, and a dopant gas containing Al and C in the molecule, wherein the input raw material C/Si ratio is set based on a total gas C/Si ratio, being a ratio between the C element and the Si element in the film-forming atmosphere containing
(Continued)

the C element included in the dopant gas, the input raw material C/Si ratio differs from the total gas C/Si ratio, and the input raw material C/Si ratio is 0.8 or less.

19 Claims, 3 Drawing Sheets

(51) Int. Cl.
 *H10D 62/832* (2025.01)
 *H01L 21/02* (2006.01)
(58) Field of Classification Search
 CPC ........... H01L 21/02378; H01L 21/0243; H01L 21/02598; C30B 29/36; C30B 25/02; C30B 25/16
 See application file for complete search history.

(56) References Cited

U.S. PATENT DOCUMENTS

| | | | | |
|---|---|---|---|---|
| 6,015,459 | A * | 1/2000 | Jamison | C30B 25/02 |
| | | | | 438/510 |
| 7,304,334 | B2 * | 12/2007 | Agarwal | H01L 29/0804 |
| | | | | 257/197 |
| 8,933,464 | B2 | 1/2015 | Nishio et al. | |
| 10,262,863 | B2 * | 4/2019 | Fukada | C30B 25/186 |
| 10,337,119 | B2 * | 7/2019 | Hori | H01L 21/02378 |
| 2003/0056718 | A1 * | 3/2003 | Kawahara | C30B 29/36 |
| | | | | 117/84 |
| 2009/0087964 | A1 * | 4/2009 | Maeda | H01L 21/30 |
| | | | | 438/482 |
| 2012/0280254 | A1 * | 11/2012 | Muto | C30B 25/16 |
| | | | | 257/77 |
| 2012/0315767 | A1 * | 12/2012 | Sasaki | C23C 16/325 |
| | | | | 438/758 |
| 2015/0162187 | A1 | 6/2015 | Miyasaka et al. | |
| 2015/0214306 | A1 | 7/2015 | Kojima et al. | |
| 2015/0267320 | A1 | 9/2015 | Ohno et al. | |
| 2021/0296443 | A1 * | 9/2021 | Wada | H01L 29/34 |

FOREIGN PATENT DOCUMENTS

| | | | |
|---|---|---|---|
| JP | 2014-187113 | A | 10/2014 |
| JP | 2015-018869 | * | 1/2015 |
| JP | 2015-018869 | A | 1/2015 |
| JP | 2015-185653 | A | 10/2015 |
| JP | 2016-117609 | A | 6/2016 |
| WO | 2013/191201 | A1 | 12/2013 |
| WO | 2014/021365 | A1 | 2/2014 |

OTHER PUBLICATIONS

N. Nordell, et al., "Control of Al and B Doping Transients in 6H and 4H SiC Grown by Vapor Phase Epitaxy", Journal of Electronic Materials, 1997, 187-192, vol. 26, No. 3.
Henrik Pedersen, et al., "Chloride-Based CVD Growth of Silicon Carbide for Electronic Applications", Chemical Reviews, 2012, 2434-2453, vol. 112.
International Search Report for PCT/JP2017/044335 dated Jan. 30, 2018 [PCT/ISA/210].
Communication dated Mar. 5, 2021, issued by the German Patent and Trade Mark Office in counterpart application 112017006615.8.
Communication dated Jul. 9, 2021 by the German Patent Office in German Application 11 2017 006 615.8.
Hrishikesh Das et al., "Triangular defects in the low-temperature halo-carbon homoepitaxial growth of 4H—SiC"; Journal of Crystal Growth; 312 (2010); pp. 1912-1919.

* cited by examiner

P-TYPE SiC EPITAXIAL WAFER AND PRODUCTION METHOD THEREFOR

TECHNICAL FIELD

The present invention relates to a p-type SiC epitaxial wafer and a production method therefor. This application is a National Stage of International Application No. PCT/JP2017/044335, filed on Dec. 11, 2017, which claims priority from Japanese Patent Application No. 2016-255541, filed Dec. 28, 2016, the contents of which are incorporated herein by reference.

BACKGROUND ART

Silicon carbide (SiC) has a dielectric breakdown electric field that is an order of magnitude larger than that of silicon (Si), and a band gap that is three times as wide. Further, silicon carbide (SiC) has a thermal conductivity that is about three times higher than that of silicon (Si). As a result, silicon carbide (SiC) holds much promise for applications to power devices, high-frequency devices, and high-temperature operation devices and the like.

The production of devices using SiC requires the addition of a dopant that controls the electrical characteristics. Known n-type dopants include nitrogen and phosphorus, and known p-type dopants include aluminum boron. Attempts are now being made to achieve high-concentration doping of these dopants in epitaxial films to lower the resistance of epitaxial films.

Much investigation has been conducted with respect to n-type SiC epitaxial films doped with an n-type dopant. In contrast, sufficient investigation has not yet been conducted with respect to p-type SiC epitaxial films doped with a p-type dopant, which have so far been limited to reports at the laboratory level.

For example, Non-Patent Document 1 and Non-Patent Document 2 disclose that p-type SiC epitaxial films can be produced using propane and silane as feedstock gases, and using trimethylaluminum (TMA) as a dopant gas.

High-concentration doping is difficult to achieve using aluminum. Consequently, in Patent Document 1, a co-doping method that performs doping of nitrogen at the same time is used to achieve high-concentration doping using aluminum.

On the other hand, in SiC epitaxial growth, the occurrence of triangular defects due to minute particles becomes problematic. Consequently, a reduction in the occurrence of defects is being sought. In SiC epitaxial growth, if the feed amount of a Si feedstock gas is increased to accelerate the growth rate, defects due to Si aggregation more readily occur. A gas containing Cl is generally used to prevent such defects from occurring.

Non-Patent Document 3 discloses a method that uses a Cl-based gas containing Cl in the molecule to obtain high-quality epitaxial films. In addition to gases that do not contain Si such as HCl, Si-containing gases such as chlorosilane are also used as the Cl-containing gas.

PRIOR ART LITERATURE

Patent Document

Patent Document 1: Japanese Unexamined Patent Application, First Publication No. 2014-187113

Non-Patent Documents

Non-Patent Document 1: Marcia Zielinski et al., Mat. Sci. Forum, Vol. 858, pp 137-142.

Non-Patent Document 2: N. Nordell and A. Schoner. Journal of Electronic Materials, Vol. 26, No. 3, 1997, p 187-192.

Non-Patent Document 3: Henrik Pedersen et al., Chem. Rev. 2012, 112, 2434-2453.

SUMMARY OF THE INVENTION

Problems to be Solved by the Invention

In the development of SiC devices conducted in recent years, p-type epitaxial wafers doped at high concentrations are being sought in order to obtain low-resistance epitaxial films. However, co-doping methods such as the method described in Patent Document 1 result in the inclusion of a high concentration of n-type impurities that affect the mobility and is generally unused.

Further, when doping of Al is performed at high concentrations, it is necessary to increase the flow rate of the Al-containing doping gas. In such cases, if a Cl-based gas used for producing a high-quality epitaxial film is used together with an Al-containing p-type dopant gas, highly volatile aluminum chloride is generated which results in the consumption of Al and Cl. As a result, the incorporation efficiency of Al into the epitaxial film decreases, and an increase in defects and the epitaxial film forming a non-mirror surface become problematic when the feed amount of the dopant gas is large. Consequently, the use of a Cl-based gas in the production of p-type SiC epitaxial wafers that are highly doped at a concentration of at least $1 \times 10^{18}$ cm$^{-3}$ has proven difficult.

Moreover, Non-Patent Document 1 and Non-Patent Document 2 are investigations at the laboratory level, and further increases in the in-plane uniformity of the dopant concentration are required for application in actual production processes. In other words, a method for producing a p-type SiC epitaxial wafer having a high in-plane uniformity of the dopant concentration at high concentrations is being sought.

The present invention has been developed in light of the above problems, and has an object of obtaining a high-quality p-type SiC epitaxial wafer having few defects and a high in-plane uniformity of the dopant concentration at a high concentration of at least $1 \times 10^{18}$ cm$^{-3}$, and a production method therefor.

Means for Solving the Problems

As a result of intensive investigation, the inventors of the present invention found that an epitaxial film becomes a non-mirror surface because the C element included in the dopant gas can no longer be ignored when a large amount of a dopant gas is introduced, and this causes the effective C/Si ratio that practically contributes to the formation of the film to increase. The present invention provides a production method according to a first aspect described below to solve the above problems.

(1) A method of producing a p-type SiC epitaxial wafer according to a first aspect is a method of producing a p-type SiC epitaxial wafer having an Al dopant concentration of at least $1 \times 10^{18}$ cm$^{-3}$, the method comprising:

a step of setting an input raw material C/Si ratio, which is a ratio between C element and Si element in a feedstock gas,     a step of obtaining a p-type SiC epitaxial wafer having an Al dopant concentration of at least $1 \times 10^{18}$ cm$^{-3}$ by forming a p-type SiC epitaxial film on a substrate in a film-forming atmosphere comprising the feedstock gas, a Cl-based gas containing Cl in the molecule, and a dopant gas containing Al and C in the molecule, and a sub-step of setting the input raw material C/Si ratio based on a total gas C/Si ratio, which is a ratio between the C element and the Si element in the film-forming atmosphere containing the C element included in the dopant gas, wherein the input raw material C/Si ratio differs from the total gas C/Si ratio, and the input raw material C/Si ratio is 0.8 or less.

The method according to the first aspect of the present invention preferably includes the characteristics of (2) to (9) below. These characteristics may be preferably combined with each other as required.

(2) The total gas C/Si ratio is preferably at least 1.0.
(3) The total gas C/Si ratio is more preferably at least 1.0 but not more than 2.1
(4) The Cl-based gas containing Cl in the molecule preferably contains HCl.
(5) A Si-based feedstock gas in the feedstock gas preferably contains Cl in the molecule.
(6) The dopant gas containing Al and C in the molecule is preferably trimethylaluminum.
(7) At least 10% of the C element in the fill forming atmosphere preferably originates from the dopant gas.
(8) Also preferable is a configuration wherein the feedstock gas does not contain the C element.
A second aspect of the present invention is a p-type epitaxial wafer described below.
(9) A p-type SiC epitaxial wafer having a dopant, concentration of at least $1 \times 10^{18}$ cm$^{-3}$, and an in-plan uniformity of the dopant concentration of 25% or less.

The wafer according to the second aspect of the present invention preferably includes the characteristics of (10) to (12) below. These characteristics may be preferably combined with each other as required.

(10) The p-type SiC epitaxial wafer described above preferably has a diameter of at least six inches.
(11) The p-type SiC epitaxial wafer according to the above aspect preferably has a diameter of less than six inches, and an in-plane uniformity of the dopant concentration of 10% or less.
(12) In the p-type SiC epitaxial wafer described above, the triangular defect density is preferably 0.1 cm$^{-2}$ or less.

Effects of the Invention

According to the method for producing a SiC epitaxial wafer of the first aspect, a p-type SiC epitaxial wafer having a high in-plane uniformity of the dopant concentration at high concentrations can be obtained.

Further, because the SiC epitaxial wafer of the second aspect has a low resistance and a high in-plane uniformity, large numbers of various devices can be produced with a uniform quality.

EMBODIMENTS FOR CARRYING OUT THE INVENTION

Preferred examples of the present invention are described below. The conditions and materials and the like presented in the following description are merely examples of the present invention, which in no way limit the present invention, and may be altered as appropriate within the scope of the present invention.

(Method for Producing p-Type SiC Epitaxial Wafer)

The method for producing a p-type SiC epitaxial wafer according to the present embodiment is a method for producing a p-type SiC epitaxial wafer having an Al dopant concentration of at least $1 \times 10^{18}$ cm$^{-3}$. This method for producing a p-type SiC epitaxial wafer comprises: a step for setting an input raw material C/Si ratio, which is a ratio between the C element and the Si element in a feedstock gas, and a step for forming a p-type SiC epitaxial film on a substrate in an atmosphere comprising the feedstock gas, a Cl-based gas containing Cl in the molecule, and a dopant gas containing Al and C in the molecule. More specifically, the production method of the present embodiment is a method for producing a p-type SiC epitaxial wafer having an Al dopant concentration of at least $1 \times 10^{18}$ cm$^{-3}$ that uses the feedstock gas, the Cl-based gas containing Cl in the molecule, and the dopant gas containing Al and C in the molecule in a film-forming atmosphere in which these gases are supplied, wherein the input raw material C/Si ratio differs from a total gas C/Si ratio, which is a ratio between the C element and the Si element in the film-forming atmosphere, the input raw material C/Si ratio is set based on the total gas C/Si ratio, and the input raw material C/Si ratio, which is a ratio between the C element and the Si element in the feedstock gas, is 0.8 or less.

First, definitions of the terminology used in the present specification are described.

(Feedstock Gas)

The "feedstock gas" is a gas that acts as a feedstock when forming a SiC epitaxial film. The gas may consist of only one type, or two or more types of gases. Although not limited thereto, the use of two types of gases is preferable. Feedstock gases are generally divided into Si-based feedstock gases composed of a compound containing Si in the molecule, and C-based feedstock gases composed of a compound containing C in the molecule. In the present embodiment, the feedstock gas includes at least a Si-based feedstock gas, and in some cases may exclude the C-based feedstock gas if required. In the present invention, a feedstock gas which is preferably used is a feedstock gas composed of only a Si-based feedstock gas, or a combination of a Si-based feedstock gas and a C-based feedstock gas. When conventional doping is performed in an epitaxial growth process, the amount of the element used as the dopant is extremely low compared to the amount of Si and C. Consequently, in conventional methods, the feedstock gas is considered as a gas that does not include a dopant gas, which is supplied with the intention of doping the epitaxial film. In the present invention, the feedstock gas is similarly a gas that does not include a dopant which is supplied with the intention of doping of Al, and is distinguished from the dopant gas. That is to say, neither the C-based feedstock gas nor the Si-based feedstock gas contain the dopant Al in the molecules.

A known gas (compound) may be used as the Si-based feedstock gas. A preferred example is silane ($SiH_4$). In addition, a gas containing a chlorine-based Si feedstock (a chloride-based feedstock-containing gas) such as dichlorosilane ($SiH_2Cl_2$), trichlorosilane ($SiHCl_3$), and tetrachlorosilane ($SiCl_4$), which contains Cl which has an etching action, can also be used. A single type of gas, or a combination of two or more types of gases may be used. The Si-based feedstock gas preferably does not contain carbon, but may contain carbon if required.

A known gas such as propane ($C_3H_8$) can be selected and used as the C-based feedstock gas. A single type of gas, or a combination of two or more types of gases may be used. The C-based feedstock gas preferably does not contain Si, but may contain Si if required.

(Cl-Based Gas)

Next, the "Cl-based gas" is described. The "Cl-based gas" refers to a gas that includes Cl as a constituent element in the molecule of the compound constituting the gas. For example, this corresponds to compounds such as hydrogen chloride (HCl), $SiH_2Cl_2$, $SiHCl_3$, and $SiCl_4$. A single type of gas, or a combination of two or more types of gases may be used. Here, gases containing both Cl and Si, such as $SiH_2Cl_2$, and $SiCl_4$ are also Si-based feedstock gases as described above. Such gases that represent both a "Cl-based gas" and a "Si-based feedstock gas" may also be used.

If a gas that represents both a "Cl-based gas" and a "Si-based feedstock gas" is used, it is not necessary to use a "Cl-based gas" that does not contain Si and/or a "Si-based feedstock gas" that does not contain Cl, but these may be used in combination with the gas if required.

(Dopant Gas)

The "dopant gas" refers to a gas that includes Al and C as constituent elements in the molecule of the compound constituting the gas. Examples thereof include alkylaluminum compounds represented by trimethylaluminum (TMA) and triethylaluminum (TEA), and cycloaluminum compounds. Because doping of Al itself is difficult, a gas of a compound that includes Al as a constituent element is used as the dopant gas. In principle, the dopant gas is a gas supplied with the intention of doping an epitaxial film with Al. Further, preferably used as the dopant gas is a gas that does not contain Si. The dopant gas may use a single type of gas, or a combination of two or more types of gases.

(Other Gases)

Other gases that may be used include carrier gases for transporting the above gases into a reaction furnace. An inert gas such as hydrogen is preferably used as a carrier gas. An atmosphere or a film-forming atmosphere is used to refer to the state of the gases inside the growth furnace. Consequently, although the atmosphere refers to a state containing hydrogen gas, hydrogen does not directly affect the epitaxial growth reaction. Therefore, although hydrogen is present inside the reaction furnace, it is not specifically mentioned below.

(Combination of Gases in Film-Forming Atmosphere)

As mentioned above, in the present invention, a single gas may combine the roles of a plurality of gases. Consequently, the "atmosphere comprising a feedstock gas, a Cl-based gas containing Cl in the molecule, and a dopant gas containing Al and C in the molecule" may be considered to include combinations such as the following.

One example is a case where each of the gases has a distinct function and therefore a separate function, and the film-forming atmosphere contains each of the gases. For example, the film-forming atmosphere may include $SiH_4$ (Si-based feedstock gas) and $C_3H_8$ (C-based feedstock gas) as feedstock gases, HCl as a Cl-based gas, and TMA is present as a dopant gas. In this case, the four types of gases above are used without any of the gases duplicating the characteristics of the others.

Further, another example is a case where the Si-based feedstock gas also acts as a Cl-based gas. For example, $SiHCl_3$ may be included as both a feedstock gas and Cl-based gas (Si-based feedstock gas, Cl-based gas), $C_3H_8$ included as a feedstock gas (C-based feedstock gas), and TMA used as a dopant gas. In this case, $SiHCl_3$ functions as a Si-based feedstock gas and as a Cl-based gas. In this example, the three types of gases above are used. If the Si-based feedstock gas also acts as the Cl-based gas, a Cl-based gas that does not contain Si may be used if required, or may be excluded.

For example, a Cl-based gas that also acts as a Si-based feedstock gas and a Cl-based gas that does not contain Si may also be used simultaneously. Specific examples thereof include a case where $SiHCl_3$ is included as both a feedstock gas and Cl-based gas (Si-based feedstock gas, Cl-based gas), $C_3H_8$ is included as a feedstock gas (C-based feedstock gas), HCl is included as an additional Cl-based gas, and TMA is used as a dopant gas. Here, four types of gases are used. $SiHCl_3$ functions as both a Si-based feedstock gas and Cl-based gas.

As a further example, the feedstock gas may exclude the based feedstock gas, and therefore not use a C-based feedstock gas as a feedstock gas. For example, the film-forming atmosphere may include $SiH_4$ as a feedstock gas (Si-based feedstock gas), HCl as a Cl-based gas, and TMA as a dopant gas. Here, three types of gases are used.

As yet another example, the feedstock gas may exclude the C-based feedstock gas, and the Si-based feedstock gas may also act as a Cl-based gas. For example, $SiHCl_3$ may be used as a feedstock gas (Si-based feedstock gas, Cl-based gas) and TMA as a dopant gas. Here, two types of gases are used.

Such an atmosphere can be obtained by selecting and supplying the feedstock gas, Cl-based gas, and dopant gas described above as required into a reaction space (growth chamber) inside a reaction furnace, which has a substrate mounted in the interior. The flow rates of the introduced gases may be arbitrarily set so as to satisfy the present invention. These gases may each be supplied into the reaction furnace from individual pipes, or collectively supplied from a single pipe. The gases are preferably individually supplied in order to avoid reactions from taking place inside the piping. Further, gases may be discharged from the growth chamber as required.

(Input Raw Material C/Si Ratio and Total Gas C/Si Ratio)

The supply ratio if the respective gases has a significant influence on the growth state and physical properties and the like of a SiC epitaxial film. Consequently, the film-forming atmosphere is controlled by setting the feed amount for each gas beforehand.

A SiC epitaxial film is obtained from a reaction between the C element and the Si element on a substrate. Consequently, the C/Si ratio, being a ratio between the element and the Si element, is a particularly important parameter.

Here, in the present specification, "C/Si ratio" has two definitions. A clear distinction is made when these are expressed.

The first one refers to a ratio between the C element and the Si element in the film forming atmosphere that forms the SiC epitaxial film. This is referred to as the "total gas C/Si ratio" because it represents the ratio between the C element and the Si element included in all of the gases used in the film-form g atmosphere.

The other one refers to the ratio between the C element and the Si element in the supplied feedstock gas. This is referred to as the "input raw material C/Si ratio" because represents the ratio between the C element and the Si element included in the supplied (input) feedstock gas.)

In a typical production method, the input raw material C/Si ratio and the total gas C/Si ratio are substantially equivalent. Further, the total gas C/Si is used in such cases as an effective ratio, that is to say, the C/Si ratio that undergoes the actual reaction. Consequently, in the SiC field, the feed ratio between the Si-based feedstock gas and the C-based feedstock teas, that is the input raw material C/Si ratio, is often treated as the C/Si ratio in the production process.

For example, a case where doping of a low concentration of a dopant is performed is described below.

For example, if a low concentration of aluminum of less than $1 \times 10^{18}$ cm$^{-3}$ is to be doped in an epitaxial film, the extremely small amount of dopant gas is not a major component of the gas that is present in the film-forming atmosphere. That is to say, the dopant gas is supplied in such a minute amount that it can be reasonably ignored relative to the feedstock gas. Consequently, even if the dopant gas includes the C element, the amount of the C element present in the dopant gas is extremely small relative to the amount of the C element present in the C-based feedstock gas and the like, and can be considered to be a range within the error. That is, in such as case, it can be said that the input raw material C/Si ratio and the total gas C/Si ratio are substantially equivalent.

Next, an example where doping of a high concentration of a dopant is performed in the manner of the present invention is described. Unlike the case of low-concentration doping described above, the method for producing a p-type SiC epitaxial wafer according to the present embodiment achieves doping of aluminum at a high concentration of at least $1 \times 10^{18}$ cm$^{-3}$. Further, the Cl element and the Al element are both present in the film-forming atmosphere. Although a high-quality epitaxial film is obtained when a Cl-based gas containing Cl in the molecule is used, there is a tendency for aluminum chloride to be generated when the and the Al element react. Aluminum chloride has a high volatility, and the incorporation efficiency of aluminum into the epitaxial film decreases when aluminum chloride is generated.

For the above reasons, the feed amount of the dopant gas is increased in order to obtain an epitaxial film doped with a high concentration of aluminum, that is to say, it is necessary to supply the dopant gas in an amount that significantly exceeds the amounts that are generally assumed. For example, it is necessary to supply the dopant gas so as to account for at least 10% of the entire C-based feedstock gas.

If the supply amount of the dopant gas becomes large, that is to say, if high-concentration doping is performed, the C element in the dopant gas that could be ignored in low-concentration doping can no longer be ignored. That is to say, the input raw material C/Si ratio and the total gas C/Si ratio, which are substantially equivalent in low-concentration doping, become no longer equivalent. That is, even if the input raw material C/Si ratio is controlled to a value such as 1, the total gas C/Si ratio becomes higher than that value, and consequently results in a large number of defects occurring in the epitaxial film due to the deviation of the ratio between C and Si. The epitaxial film becomes a non-mirror surface when a large number of defects occur in the epitaxial film. This is a problem first encountered when high-concentration doping of aluminum is performed in an atmosphere where the Cl element and the Al element both exist.

Consequently, in the method for producing a p-type SiC epitaxial wafer according to the present embodiment, the input raw material C/Si ratio is set beforehand based on the total gas C/Si ratio. The C element used to calculate the total gas C/Si ratio at this point includes the C element in the dopant gas in the calculated value. Consequently, the value of the input raw material C/Si ratio differs front that of the total gas C/Si ratio.

SiC is obtained from a one-to-one bond between silicon and carbon. Consequently, the total gas C/Si ratio is typically and preferably set in the vicinity of 1.0. However, incorporation the film of the C element originating from the dopant gas is more difficult than that of the C element originating from the C-based feedstock gas. Therefore, the ratio is preferably set taking this aspect into consideration.

In the production method of the present invention, one or more steps selected from the following sub-steps may be preferably included.

A sub-step for determining the type of gases to be used as a feedstock gas (C-based feedstock gas, Si-based feedstock gas), Cl-based gas, and dopant gas in the film-forming atmosphere.

A sub-step for determining a relative incorporation efficiency $\alpha$ of the C element in a dopant gas by performing an experiment using the gas combination.

A sub-step for using the obtained relative incorporation efficiency $\alpha$ of the C element in the dopant gas to determine a C/Si ratio of a feedstock gas (C-based feedstock gas, Si-based feedstock gas) or a C/Si ratio of a combination of a feedstock gas (C-based feedstock gas, Si-based feedstock gas) and a Cl-based gas used in an actual production process.

In the final sub-step described above, the C/Si ratio is preferably determined taking the relative incorporation efficiency $\alpha$ of the C element of the dopant and the usage ratio of the dopant gas into consideration. The ratio between the C element and the Si element that actually contribute to the reaction in the film-forming atmosphere, is preferably adjusted to be in the vicinity of 1.

(Relative Incorporation Efficiency $\alpha$ of C Element of Dopant)

The relative incorporation efficiency $\alpha$ of the C element originating from the dopant gas (as a proportion to the incorporation efficiency of the C element originating from the feedstock gas) may be calculated taking the total gas C/Si ratio, the input raw material C/Si ratio, and the SiC epitaxial fain formation reaction process into consideration. Specifically, is expressed by the general formula (1) below.

$$\{(C \text{ originating from dopant gas}) \times \alpha\}/Si = (\text{total gas C/Si ratio}) - (\text{input raw material C/Si ratio}) \quad (1)$$

The general formula (1) expresses a in terms of an effective ratio of the incorporation efficiency of the C element originating from the dopant gas with respect to an effective ratio of the incorporation efficiency of the C element originating from the feedstock gas.

In the chemical composition of SiC, a one-to-one bond is formed between the Si element and the C element. Consequently, it is generally desirable for the C/Si ratio in the atmosphere gas (film-forming atmosphere gas) to be controlled within a fixed range in the vicinity of 1.

If the ratio exceeds the fixed range in the vicinity of 1 described above, normal epitaxial growth does not occur due to the ratio at the growth surface becoming biased toward either C or Si, resulting in surface abnormalities such as cloudiness and a tendency for accompanying defects to occur.

As a result of experimentation, it was found that the relative incorporation efficiency $\alpha$ of the C element originating from the dopant gas is smaller than 1.0, and is approximately 0.7. Therefore, this relative incorporation efficiency is preferably taken into consideration when setting the total gas C/Si ratio. Further, the input raw material C/Si ratio is preferably set based on the calculated effective C/Si ratio.

If conditions are set in the manner of normal growth assuming that the input raw material C/Si ratio represents the effective C/Si ratio, addition of the portion of the C element originating from TMA causes the C/Si ratio to become larger than the optimal value.

Further, if conditions are set taking the portion of the C element originating from TMA into consideration, the assumption that the effective ratio $\alpha$ of the incorporation efficiency of the C element originating from TMA is 1.0 as for the C-based raw material causes the C/Si ratio to become larger than the optimal value.

That is to say, if the input raw material C/Si ratio is set with $\alpha$ set to 1, the input raw material C/Si ratio is lowered too far and the effective C/Si ratio becomes lower than the optimal C/Si ratio. Because the Al incorporation efficiency into the epitaxial film is reduced when the C/Si ratio decreases, the formation of a high-concentration player becomes problematic. Therefore, experiments such as those described below were performed to calculate the true value of $\alpha$ by comparing conditions in which effective C/Si ratios were similar.

(Experiments for Obtaining Relative Incorporation Efficiency $\alpha$)

In the epitaxial growth of SiC, it is known that in order to obtain a flat mirror surface, the C/Si ratio actually contributing to the reaction, that is to say, the effective C/Si ratio, preferably lies within a fixed range. In particular, if the effective C/Si ratio is higher than the appropriate range of values, the whole surface becomes cloudy. However, if the effective C/Si ratio is in the vicinity of the upper limit of the appropriate range, cloudiness only occurs locally.

The inventors of the present invention used the phenomenon described above to perform experiments examining the vicinity of the upper limit of the effective C/Si ratio at which a mirror surface is obtained (comparative experiments 1 to 3). Further, the relative incorporation efficiency $\alpha$ of the C element from the dopant was estimated using propane as a reference C-based feedstock gas. From the results of the experiments carried out under the conditions below, it was found to be sufficient that when propane was used as the reference, of the entire C-based feedstock gas approximately 70% of the C component originating from the dopant gas was incorporated as the C component of SiC.

Comparative Experiment 1

A four-inch SiC single crystal substrate was prepared. The prepared SiC single crystal substrate was a 4H polytype in which the primary (0001) Si plane had a 4° off-angle. The SiC single crystal substrate was then introduced into a growth furnace. A feedstock gas, a Cl-based gas, and a dopant gas were introduced to a film-forming atmosphere enclosed by the growth furnace, and growth was carried out at a growth temperature of 1,600° C.

In terms of the gases used, the Si-based feedstock gas was TCS (trichlorosilane) the C-based feedstock gas was propane, the dopant gas was TMA, and the Cl-based gas was hydrogen chloride.

The input raw material C/Si ratio was 0.6, and the HCl/TCS ratio was 6. TMA was introduced in an amount representing at least 50% of the total C-based gas, and epitaxial growth of high-concentration p-type SiC was performed. As a result, partial cloudiness occurred in a 2 cm region on an outer peripheral portion of the four-inch wafer. At this time, the total gas C/Si ratio was 2.25, when it was assumed that a relative incorporation efficiency $\alpha$ is 1 for C from the dopant when referenced to propane.

Comparative Experiment 2

The C/Si ratio was changed. The input raw material C/Si ratio was set to 0.5. Otherwise, the experiment was performed in the same manner as comparative experiment 1. As a result, a mirror surface was obtained over the entire surface of the four-inch wafer. At this time, the total gas C/Si ratio was 2.16.

Comparative Experiment 3

The C/Si ratio was changed again. The input raw material C/Si ratio was set to 0.8. Otherwise, the experiment was performed in the same manner as comparative experiment 1. At this time, the amount of TMA introduced was changed such that the total gas C/Si ratio became 1.96. As a result, a several mm region of the outermost peripheral portion of the four-inch wafer became a non-mirror surface.

In these experiments, the effective C/Si ratios are considered to be substantially equivalent from a comparison of the state of the surfaces. These wafers are largely mirror surfaces, and only a small portion of the wafers in comparative experiments 1 and 3 had started to become non-mirror surfaces. When the effective C/Si ratio was made larger than in these cases, the entire surface of the wafer progressively becomes a non-mirror surface. Therefore, these cases are considered to be the upper limit at which a mirror surface can be obtained. The effective C/Si at which a mirror surface can be obtained under the same conditions as these experiments was approximately 1.7. Calculation of the relative incorporation efficiency $\alpha$ from these results revealed a value of approximately 0.7. From the above, it was found that when propane was used as the reference, of the entire C-based feedstock gas approximately 70% of the C component originating from the dopant gas was incorporated as the C component of SiC.

The input raw material C/Si ratio is preferably 0.8 or less, more preferably 0.5 or less, and even more preferably 0.4 or less. In particular, when an epitaxial film is formed on a large wafer of at least six inches, because it is necessary to supply a larger amount of the dopant gas, the input raw material C/Si ratio is preferably set to 0.4 or less.

(Effects of Production Method and Preferred Conditions)

As described above, the method for producing a p-type epitaxial wafer according to the present embodiment is performed in a film-forming atmosphere comprising a feedstock gas, a Cl-based gas containing Cl in the molecule, and a dopant gas containing Al and C in the molecule. Consequently, the aluminum dopant can be doped uniformly in the in-plane direction of the substrate at a high concentration.

Further, the C element originating from the dopant gas is not ignored and is taken into consideration when setting the total gas C/Si ratio. Moreover, the total gas C/Si ratio takes into consideration the actual incorporation efficiency of the C element originating from the dopant gas into the epitaxial film. Consequently, it is possible to avoid a case where the C element in the film-forming atmosphere becomes excessive, which enables a high-quality p-type SiC epitaxial wafer to be obtained.

In addition, since the C element originating from the dopant gas is taken into consideration, the input raw material C/Si ratio is set lower than 1.0, and is 0.8 or less. In such cases, although the total gas C/Si ratio can be selected as required, a value of 1 to 2.1 is desirable. A ratio of 1 to 2.1 enables the epitaxial surface to be obtained as a mirror surface.

When the total gas C/Si ratio is set taking the relative incorporation efficiency α into consideration, of the C element in the film-forming atmosphere the proportion of the C element originating from the dopant gas becomes larger. This proportional be for example, according to the desired dopant concentration or the desired surface state of the wafer and the like.

For example, if a dopant concentration of $1 \times 10^{18}$ cm$^{-3}$ is required, it is sufficient for the proportion of the C element originating from the dopant gas within the C element in the film-forming atmosphere to be set to approximately 10%. If a dopant concentration of $5 \times 10^{18}$ cm$^{-3}$ is required, it is sufficient for the proportion of the C element originating from the dopant gas within the C element in the film-forming atmosphere to be set to approximately 50%, for example. If a dopant concentration of $1 \times 10^{19}$ cm$^{-3}$ is required, it is sufficient for the proportion of the C element originating from the dopant gas within the C element in the film-forming atmosphere to be set to approximately 80%, for example.

Further, depending on the conditions, the p-type SiC epitaxial wafer can be produced using an input raw material C/Si ratio of 0, that is to say, without using a C-based feedstock gas.

The Cl flow rate with respect to the feedstock gas can be determined taking the desired dopant concentration or surface state into consideration. For example, the Cl/Si ratio can be set to at least 3, at least 5, or at least 7. If the Cl concentration is high, the generation of defects is suppressed and a good SiC epitaxial surface can be obtained.

(p-Type SiC Epitaxial Wafer)

The p-type SiC epitaxial wafer according to the present embodiment is obtainer by the method for producing a p-type SiC epitaxial wafer described above.

The p-type SiC epitaxial wafer according to the present embodiment has a dopant concentration of at least $1 \times 10^{18}$ cm$^3$, and preferably at least $1 \times 10^{19}$ cm$^{-3}$. SiC epitaxial wafers doped with a high concentration of a p-type dopant have a low resistance, and have a high versatility for various devices.

Further, the p-type SiC epitaxial wafer according to the present embodiment preferably has an in-plane uniformity of the dopant concentration of 25% or less, more preferably 18% or less, and even more preferably 10% or less. Here, the in-plane uniformity of the dopant concentration is obtained by dividing the difference between the maximum dopant concentration value and the minimum dopant concentration value by the average dopant concentration value in the in-plane direction, and then multiplying the result by 100.

The mixing of the Cl-based gas in the film-forming atmosphere is considered to have a significant effect in achieving a superior in-plane uniformity of the dopant concentration.

The Al incorporation efficiency of the p-type SiC epitaxial wafer is influenced by the C/Si ratio of the epitaxial surface. This is because Al occupies Si ties, and Al is more easily incorporated when the surface is C-rich and Si holes readily occur. In reality, the C/Si ratio is an important parameter for adjusting the in-plane distribution of Al doping. In the present embodiment, the C/Si ratio is adjusted to an optimal state to achieve uniformity in the in-plane distribution in regions that are highly doped with Al. In particular, by including HCl in the Cl-based gas, or more preferably, by using HCl as the Cl-based gas, the Cl concentration which influences the reaction of the dopant gas such as TMA inside the growth furnace can be changed independently of the C/Si ratio. This aspect increases the degree of freedom of adjustment and works favorably in terms of the uniformity.

A plurality of devices is produced from a single p-type SiC epitaxial wafer. Consequently, if the in-plane uniformity of the dopant concentration in the p-type SiC epitaxial wafer is high, the yield of devices that satisfy a predetermined range of conditions is increased.

Further, the diameter of the p-type SiC epitaxial wafer is preferably at least four inches, and more preferably more than six inches.

It is important for the wafer to be at least six inches. This allows a greater number of SiC devices having characteristics such as a small power loss due to the low resistance to be produced from a single SiC epitaxial wafer, and enables low-cost SiC devices to be realized. Although SiC devices have extremely high performance, the high cost compared to Si devices is problematic. Large p-type SiC wafers having a high in-plane uniformity of the dopant concentration would lead to significant reductions in the production costs of SiC devices.

On the other hand, the larger the diameter of the wafer, the more difficult it becomes to keep the conditions for film formation constant between the outer peripheral section and the central section of the wafer. Larger p-type epitaxial wafers having a high in-plane uniformity of the dopant concentration can be obtained for the first time using the production method described above. If the diameter of the wafer is less than six inches, the in-plane uniformity of the dopant concentration can be increased to 10% or less.

Further, the p-type SiC epitaxial wafer according to the present embodiment preferably has a triangular defect density of 0.1 cm$^{-2}$ or less.

A triangular defect refers to a defect that appears as a triangular shape under an optical microscope. Triangular defects are defects that are formed along the step flow growth direction (<11-20> direction) and are formed facing a direction in which the apex of the triangle and the opposite side (bottom side) are aligned from the upstream side toward the downstream side. Triangular defects cause polymorphism, and adversely affect devices due to differences in the electrical characteristics from a normal epitaxial layer.

Triangular defect are suppressed by mixing a Cl-based gas in the film-forming atmosphere. The Cl-based gas suppresses the occurrence of defects such as Si droplets, which become the origin of triangular defects. In the present embodiment, the Cl-based gas containing Cl in the molecule and the dopant gas are used simultaneously. As a result, a high-quality epitaxial film can be obtained even when Al is doped. In other words, a p-type SiC epitaxial wafer having few triangular defects can be obtained by supplying the Cl-based gas in the film-forming atmosphere.

As described above, because the p-type SiC epitaxial wafer according to the present embodiment has a high in-plane uniformity of the dopant concentration, the yield of SiC devices can be increased. Further, since the wafer has a low resistance, use variety of SiC devices is made possible.

Furthermore, in the present invention, because superior effects are obtained, it is not necessary to simultaneously perform doping of nitrogen at the time of production.

A preferred embodiment of the present invention has been described above in detail, but the present invention is not limited to this specific embodiment, and various modifications and alterations are possible without departing from the scope of the present invention disclosed within the claims.

EXAMPLES

Examples of the present invention are described below. The present invention is in no way limited to the following examples.

Example 1

A six-inch SiC single crystal substrate was prepared. The prepared SiC single crystal substrate was a 4H polytype in which the primary plane had a 4° off-angle.

The SiC single crystal substrate was then introduced into a growth furnace, and gases were introduced to a film-forming atmosphere enclosed by the growth furnace. In terms of the gases used, the Si-based feedstock gas was trichlorosilane (TCS), C-based feedstock gas gas propane, the dopant gas was triethylaluminum (TMA), and the Cl-based gas was hydrogen chloride (HCl).

The input raw material C/Si ratio was 0.4, and the HCl/TCS ratio (Cl-based gas/Si-based feedstock gas) was 6. Further, SiC was epitaxially grown while changing the feed amount of the dopant gas, affording the p-type SiC epitaxial wafer. During this time, by changing the feed amount of the dopant gas, the total gas C/Si ratio was varied between values of 1.51 (total gas C/Si ratio at the start of the experiment), 1.79, and 2.06. The proportion the C element originating from the dopant gas to the C element in the film-forming atmosphere gas eventually reached 80%.

Example 2

Example 2 differs from Example 1 in that the feed amount of HCl was changed. The other conditions were the same as those of Example 1.

In Example 2, the Si-based feedstock gas was TCS, the C-based feedstock gas was propane, the dopant gas was TMA, and the Cl-based gas was hydrogen chloride. The HCl/TCS ratio was 4.

Further, SiC was epitaxially grown while changing the feed amount of the dopant gas, afford the p-type SiC epitaxial wafer. During this time, by changing the feed amount of the dopant gas, the total gas C/Si ratio was varied between values of 1.51, 1.79, and 2.06. The proportion of the C element originating from the dopant gas to the C element in the film-forming atmosphere eventually reached 80%.

Example 3

Example 3 differs from Example 1 in that a C-based feedstock gas was not used. The other conditions were the same as those of Example 1.

In Example 3, the Si-based feedstock gas was TCS, the dopant gas was TMA, and the Cl-based gas was hydrogen chloride. The input raw material C/Si ratio was 0, and the amount of HCl gas introduced was 6 in terms of the HCl/TCS ratio.

Then, SiC was epitaxially grown while changing the feed amount of the dopant gas, affording the p-type SiC epitaxial wafer. During this time, by changing the feed amount of the dopant gas, the total gas C/Si ratio was varied between values of 1.41, 1.76, and 2.12. The proportion of the C element originating from the dopant gas to the C element in the film-forming atmosphere gas reached 100%.

Figure 1:
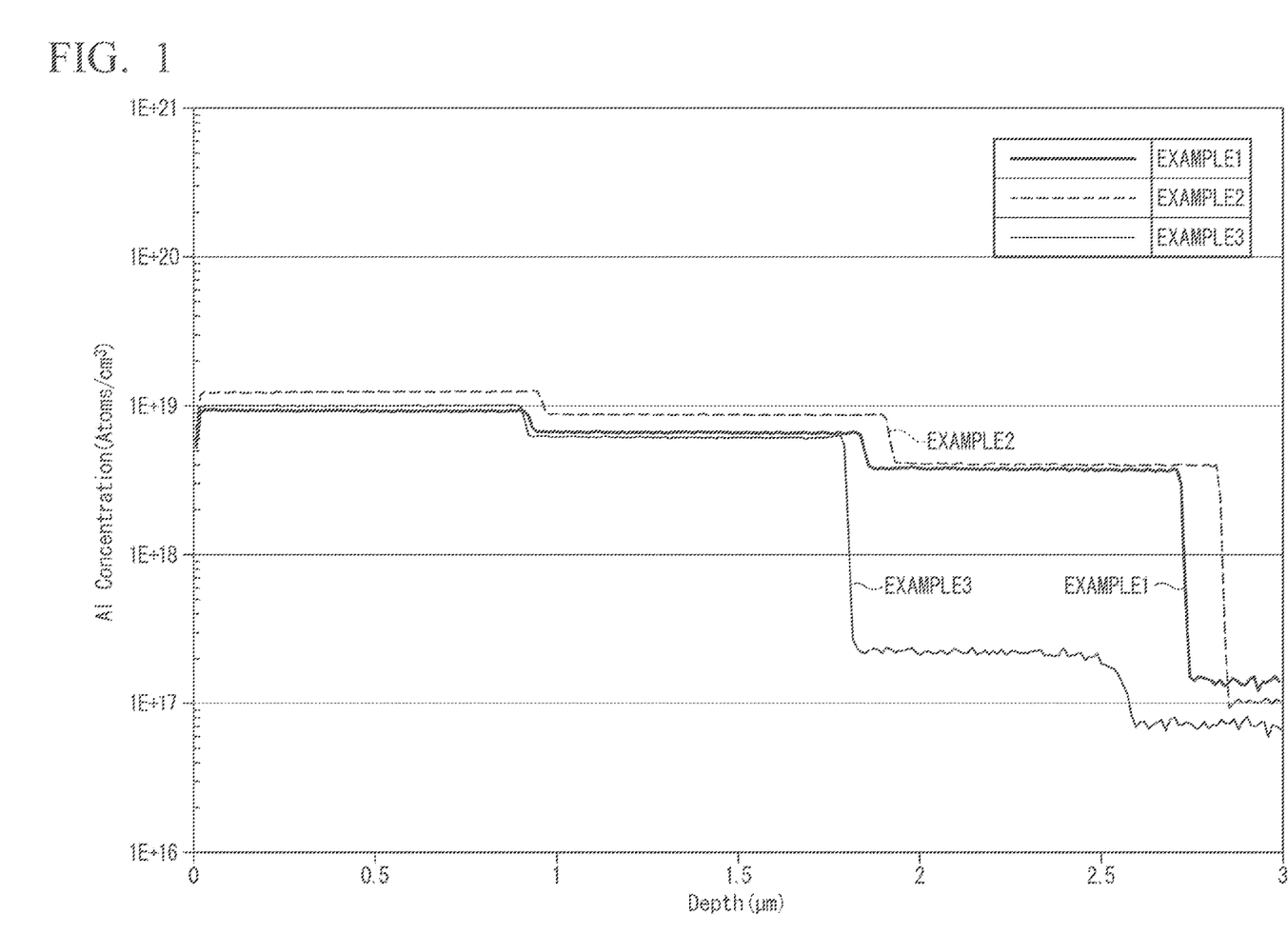
FIG. 1 shows results wherein the dopant concentration of aluminum, which is the dopant of the p-type SiC epitaxial wafers produced in Examples 1 to 3, was measured from the lamination surface toward the thickness direction using secondary ion mass spectrometry (SIMS).

The concentration of Al, which acts as the dopant of the p-type SiC epitaxial wafers produced in Examples 1 to 3, was measured from the lamination surface toward the thickness direction using secondary ion mass spectrometry (SIMS). The results are shown in FIG. 1. The vertical axis represents the dopant concentration per unit area, and the horizontal axis represents the depth in the thickness direction from the surface of the epitaxial film. It can be understood that p-type SiC epitaxial wafers having A concentration of the dopant Al (Al dopant concentration) of at least $1 \times 10^{18}$ cm$^{-3}$ have been produced.

As shown in FIG. 1, the aluminum dopant concentration changed with variation in the feed amount of the dopant gas. Therefore, it can be said that aluminum was appropriately incorporated into the epitaxial film. Further, a high concentration of aluminum of $1 \times 10^{19}$ cm$^{-3}$ as successfully doped at the outermost surface of the epitaxial film.

Figure 2:
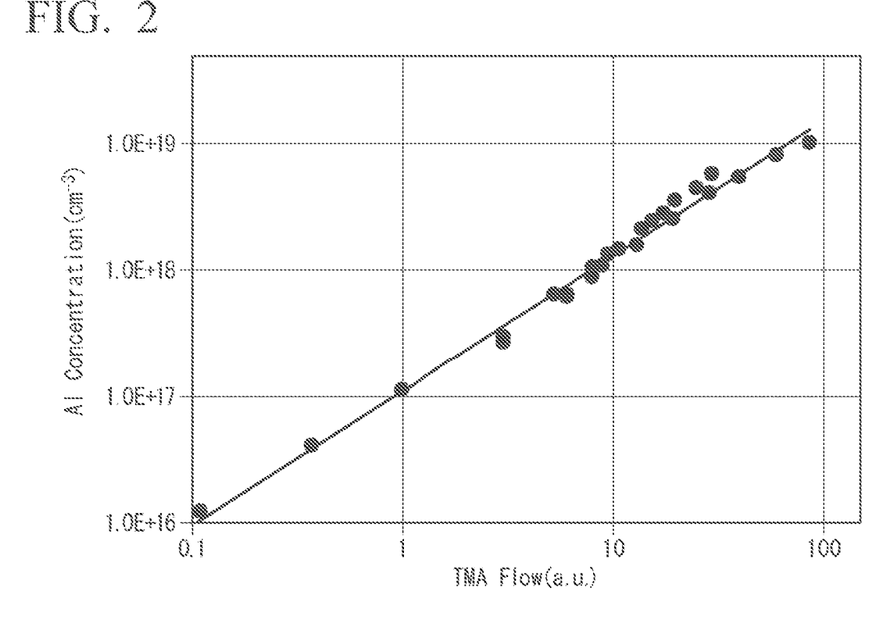
FIG. 2 is a graph showing the change in aluminum concentration in epitaxial films relative to the amount of dopant gas introduced.

Moreover, FIG. 2 is a graph showing the change in aluminum concentration in epitaxial films relative to the amount of dopant gas introduced. FIG. 2 includes the results of Examples 1 to 3 and other evaluation results. Those results where the Al concentration is at least $1 \times 10^{18}$ cm$^{-3}$ were obtained using the conditions of the present embodiment, while those below $1 \times 10^{18}$ cm$^{-3}$ were obtained using conventional conditions for low-concentration doping. As shown in FIG. 2, it can be understood that the aluminum concentration increases when the amount of dopant gas introduced is increased. The vertical axis represents the dopant concentration per unit area, and the horizontal axis represents the amount of dopant gas introduced.

Figure 3:
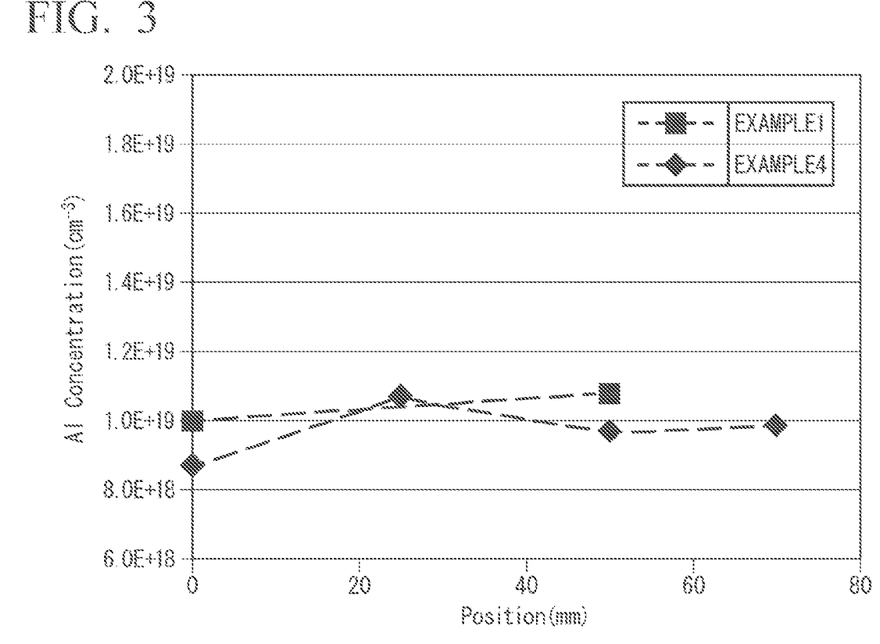
FIG. 3 is a graph showing the in-plane uniformity of the dopant concentration in p-type SiC epitaxial wafers produced in Example 1 and Example 4.

Further, the in-plane uniformity of the dopant concentration at the surface of the p-type SiC epitaxial wafer produced in Example 1 was also measured. The measurement result for Example 1 is shown in FIG. 3. The vertical axis of FIG. 3 represents the aluminum concentration, and the horizontal axis represents the distance from the center of the SiC epitaxial wafer.

Example 4

Moreover, in Example 4, the size of the SiC single crystal substrate was changed to four inches. The other conditions were the same as those of Example 1. The in-plane uniformity of the dopant concentration in the p-type SiC epitaxial wafer produced in Example 4 was also measured. The measurement result for Example 4 is shown in FIG. 3.

As shown in FIG. 3, the in-plane uniformity of the dopant concentration in the p-type SiC epitaxial wafer produced in Example 1 was 20.5%. Further, the in-plane uniformity of the dopant concentration in the p-type SiC epitaxial wafer produced in Example 4 was 7.7%. That is to say, p-type SiC epitaxial wafers having a high in-plane uniformity of the dopant concentration were obtained. The in-plane uniformity of the dopant concentration was obtained by dividing the difference between the maximum dopant concentration value and the minimum dopant concentration value by the average dopant concentration value in the in-plane direction, and then multiplying the result by 100.

Figure 4:
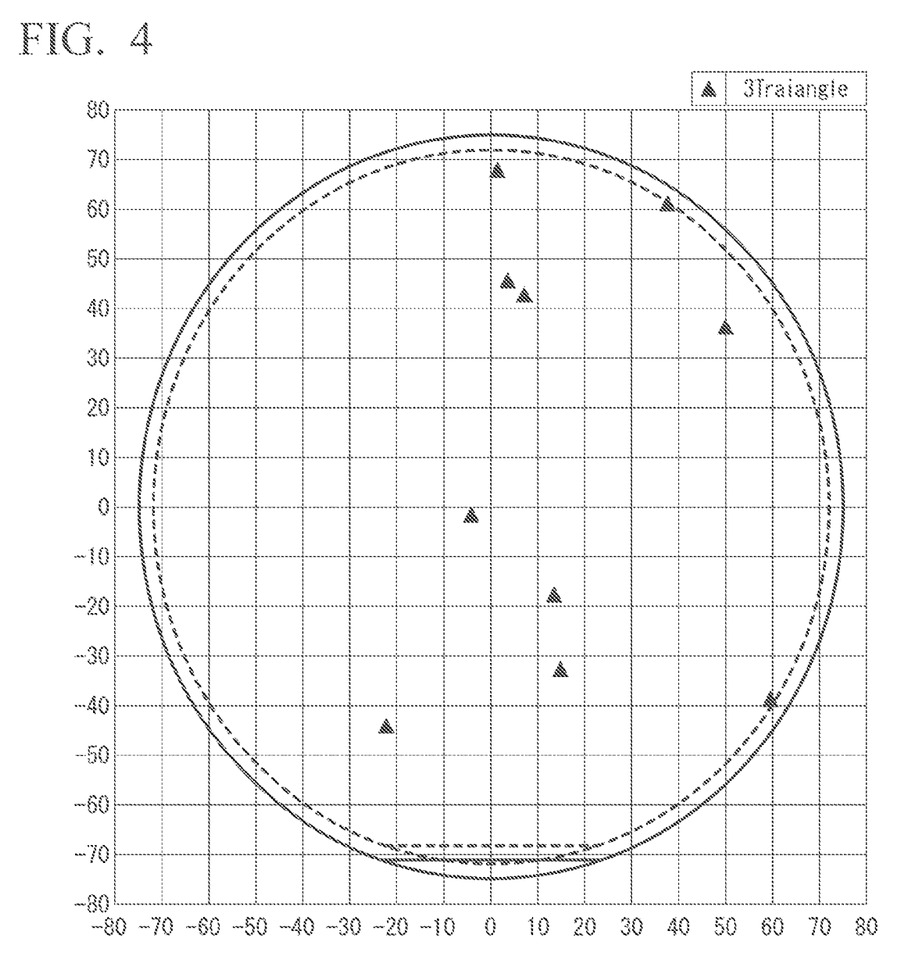
FIG. 4 shows the distribution of triangular defects in a six-inch p-type SiC epitaxial wafer produced in Example 1.

Moreover, as shown n FIG. 4, the triangular defect density was measured for the six-inch p-type SiC epitaxial wafer obtained in Example 1. The triangular defect density of the six-inch p-type SiC epitaxial wafer presented in Example 1 was 0.06 cm$^{-2}$. The triangular defect density significantly affects the device production yield. The method for producing p-type SiC epitaxial wafer according to the present embodiment affords low-defect p-type epitaxial wafers which enable the device yield to be increased. Consequently, the present invention greatly contributes to cost reductions in device production.

INDUSTRIAL APPLICABILITY

The present invention is able to provide a p-type SiC epitaxial wafer having a high in-plane uniformity of the dopant concentration at high concentrations, and a production method therefor.

The method for producing a p-type SiC epitaxial wafer according to the present invention yields low-defect p-type epitaxial wafers, and enables the device yield to be increased. Consequently, the present invention greatly contributes to cost reductions in device production.

The invention claimed is:

1. A p-type SiC epitaxial wafer comprising a p-type SiC epitaxial film, wherein the p-type SiC epitaxial film has an Al dopant concentration of at least $1 \times 10^{18}$ cm$^{-3}$, and an in-plane uniformity of the dopant concentration of 25% or less,
   the wafer has a diameter of at least six inches, and
   the wafer has a triangular defect density of 0.1 cm$^{-2}$ or less.

2. A method of producing the p-type SiC epitaxial wafer comprising a p-type SiC epitaxial film according to claim 1, wherein the p-type SiC epitaxial film has an Al dopant concentration of at least $1 \times 10^{18}$ cm$^{-3}$ and an in-plane uniformity of the dopant concentration of 25% or less, the method comprising:
   a step of setting an input raw material C/Si ratio, which is a ratio between C element and Si element in a feedstock gas,
   a step of obtaining a p-type SiC epitaxial wafer having an Al dopant concentration of at least $1 \times 10^{18}$ cm$^{-3}$ by forming a p-type SiC epitaxial film on a substrate in a film-forming atmosphere comprising the feedstock gas, a Cl-based gas containing Cl in the molecule, and a dopant gas containing Al and C in the molecule, and
   a sub-step of setting the input raw material C/Si ratio based on a total gas C/Si ratio, being a ratio between the C element and the Si element in the film-forming atmosphere containing the C element included in the dopant gas, wherein
   the input raw material C/Si ratio differs from the total gas C/Si ratio, and
   the input raw material C/Si ratio is 0.8 or less.

3. The method for producing a p-type SiC epitaxial wafer according to claim 2, wherein the total gas C/Si ratio is at least 1.0.

4. The method for producing a p-type SiC epitaxial wafer according to claim 2, wherein the total gas C/Si ratio is at least 1.0 but not more than 2.1.

5. The method for producing a p-type SiC epitaxial wafer according to claim 2, wherein the Cl-based gas containing Cl in the molecule includes HCl.

6. The method for producing a p-type SiC epitaxial wafer according to claim 2, wherein, a Si-based feedstock gas in the feedstock gas contains Cl in the molecule.

7. The method for producing a p-type SiC epitaxial wafer according to claim 2, wherein the dopant gas containing Al and C in the molecule is trimethylaluminum.

8. The method for producing a p-type SiC epitaxial wafer according to claim 2, wherein at least 10% of the C element in the film-forming atmosphere originates from the dopant gas.

9. The method for producing a p-type SiC epitaxial wafer according to claim 8, wherein the feedstock gas does not contain the C element.

10. The p-type SiC epitaxial wafer according to claim 1, wherein the wafer has an in-plane uniformity of the dopant concentration of 10% or less.

11. The p-type SiC epitaxial wafer according to claim 1, wherein the in-plane uniformity of the dopant concentration is a value which is obtained by dividing a difference between a maximum dopant concentration value of the wafer and a minimum dopant concentration value of the wafer by an average dopant concentration value in an in-plane direction of the wafer, and multiplying the divided difference by 100.

12. The p-type SiC epitaxial wafer according to claim 1, wherein the in-plane uniformity of the dopant concentration is 18% or less.

13. The p-type SiC epitaxial wafer according to claim 1, wherein the in-plane uniformity of the dopant concentration is 10% or less.

14. The p-type SiC epitaxial wafer according to claim 1, wherein the in-plane uniformity of the dopant concentration is 7.7 to 20.5%.

15. The p-type SiC epitaxial wafer according to claim 1, wherein the in-plane uniformity of the dopant concentration is 7.7% or more.

16. The p-type SiC epitaxial wafer according to claim 1, wherein the p-type SiC epitaxial wafer includes a SiC single crystal substrate on which the p-type SiC epitaxial film has been directly formed.

17. The p-type SiC epitaxial wafer according to claim 1, wherein the p-type SiC epitaxial wafer is generated by a method comprising:
   a step of setting an input raw material C/Si ratio, which is a ratio between C element and Si element in a feedstock gas,
   a step of obtaining the p-type SiC epitaxial wafer having an Al dopant concentration of at least $1 \times 10^{18}$ cm$^{-3}$ by forming the p-type SiC epitaxial film on a substrate in a film-forming atmosphere comprising the feedstock gas, a Cl-based gas containing Cl in the molecule, and a dopant gas containing Al and C in the molecule, and
   a sub-step of setting the input raw material C/Si ratio based on a total gas C/Si ratio, being a ratio between the C element and the Si element in the film-forming atmosphere containing the C element included in the dopant gas, wherein
   the input raw material C/Si ratio differs from the total gas C/Si ratio, and
   the input raw material C/Si ratio is 0.8 or less.

18. The p-type SiC epitaxial wafer according to claim 1, wherein depth of the p-type SiC epitaxial film in a thickness direction from a surface of the SiC epitaxial film is 0.1 μm or more.

19. The p-type SiC epitaxial wafer according to claim 1, wherein depth of the p-type SiC epitaxial film in a thickness direction from a surface of the SiC epitaxial film is 1 μm or more.

* * * * *